United States Patent
Lin et al.

(10) Patent No.: US 7,322,072 B2
(45) Date of Patent: Jan. 29, 2008

(54) FAST DISASSEMBLING JOINT STRUCTURE

(75) Inventors: Cheng-Wang Lin, Panchiao (TW); Chien-Chih Tung, Taipei Shien (TW); Jason Cheng, Tao Yuan Shien (TW)

(73) Assignee: Quanta Computer Inc., Tao Yuan Shien (TW)

( * ) Notice: Subject to any disclaimer, the term of this patent is extended or adjusted under 35 U.S.C. 154(b) by 299 days.

(21) Appl. No.: 11/124,081

(22) Filed: May 9, 2005

(65) Prior Publication Data

US 2006/0130424 A1 Jun. 22, 2006

(30) Foreign Application Priority Data

Dec. 8, 2004 (TW) ............................... 93219773 U

(51) Int. Cl.
*E05D 5/02* (2006.01)
(52) U.S. Cl. .............................. 16/252; 16/257; 16/270
(58) Field of Classification Search ................ 16/252, 16/257, 258, 229–231, 260–262, 267, 270; 220/836, 326, 833–835, 845, 532, 533; 49/381, 49/501; 292/DIG. 17, 163, 177, 181; 361/680–683
See application file for complete search history.

(56) References Cited

U.S. PATENT DOCUMENTS

| | | | | |
|---|---|---|---|---|
| 2,778,053 A | * | 1/1957 | Hess et al. ................... | 16/258 |
| 2,974,354 A | * | 3/1961 | Matuzas ....................... | 16/258 |
| 3,406,995 A | * | 10/1968 | McCarthy .............. | 292/169.15 |
| 3,997,939 A | * | 12/1976 | Wilhelmsen .................. | 16/261 |
| 4,395,784 A | * | 8/1983 | Foster ........................... | 4/236 |
| 4,873,745 A | * | 10/1989 | Ramsauer .................... | 16/258 |
| 5,054,164 A | * | 10/1991 | Blanco-Equiluz ............ | 16/258 |
| 6,082,352 A | * | 7/2000 | Hsu ........................... | 126/194 |
| 6,105,809 A | * | 8/2000 | Yamanaka ................... | 220/326 |
| 6,594,860 B2 | * | 7/2003 | Czipri ........................ | 16/367 |

FOREIGN PATENT DOCUMENTS

GB 2113291 A * 8/1983

* cited by examiner

*Primary Examiner*—Chuck Y. Mah
(74) *Attorney, Agent, or Firm*—Rabin & Berdo, PC

(57) ABSTRACT

A fast disassembling joint structure includes a base part and a removable part. One end of the removable part is secured to a desired structure; the other end is a connection arm. The housing has a raceway and a first semi-circular concavity. The movable clamp has an insertion section to engage a recess of the connection arm. The insertion section has a second semi-circular concavity to fit with the first semi-circular concavity so as to pivotally connect with the connection arm. A spring is adapted to provide a push force for the movable clamp. A top cover, secured on the housing, is employed to house the spring and movable clamp inside. A handle of the movable clamp extends out of an opening of the cover so that users can manually control the handle to disassemble the removable part.

8 Claims, 5 Drawing Sheets

US 7,322,072 B2

FAST DISASSEMBLING JOINT STRUCTURE

The present application is based on, and claims priority from, Taiwan Application Serial Number 93219773, filed Dec. 8, 2004, the disclosure of which is hereby incorporated by reference its entirety.

RELATED APPLICATION

The present application is based on, and claims priority from, Taiwan Application Serial Number 93219773, filed Dec. 8, 2004, the disclosure of which is hereby incorporated by reference herein in its entirety.

BACKGROUND

1. Field of Invention

The present invention relates to a joint structure for an electronic device. More particularly, the present invention relates to a fast disassembling joint structure for an electronic device.

2. Description of Related Art

A joint structure is used to interconnect two structures, where one is pivotable in relation to the other.

A conventional joint structure includes two plates, which are respectively secured by means of screws to two apparatuses that need to be interconnected. Before disassembling the two apparatuses, all screws fastened on the plates need to be removed.

However, the conventional joint structure, as mentioned above, cannot be applied in some applications, which need to be frequently assembled and disassembled, such as a housing of an electronic device disassembled for periodic maintenance. Much time is consumed in removing the screws that fasten the joint structure to the housing before the electronic device can be maintained. Assembling the housing of the electronic device is another time-consuming and inconvenient operation.

For the foregoing reasons, there is a need to improve the conventional joint structure in order to satisfy those applications that need to be frequently assembled and disassembled.

SUMMARY

It is therefore an objective of the present invention to provide a joint structure for applications that need to be frequently assembled and disassembled.

In accordance with the foregoing and other objectives of the present invention, a fast disassembling joint structure includes a base part and a removable part. One end of the removable part is secured to a desired structure; the other end is a connection-arm. The base part includes a housing, a movable clamp, a spring and a top cover. The housing has a raceway and a first semi-circular concavity. The raceway houses a movable clamp inside. The movable clamp has an insertion section to engage a recess of the connection arm. The insertion section has a second semi-circular concavity to fit with the first semi-circular concavity so as to pivotally connect with the connection arm. A spring is adapted to provide a pull force for the movable clamp. A top cover, secured on the housing, is employed to house the spring and movable clamp inside. A handle of the movable clamp extends out of an opening of the cover so that users can manually control the handle to disassemble the removable part.

Thus, a fast disassembling joint structure is employed in some applications that need to be frequently assembled and disassembled, saving the time and labor in removing the screws that fasten the joint structure to the housing.

It is to be understood that both the foregoing general description and the following detailed description are by examples and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
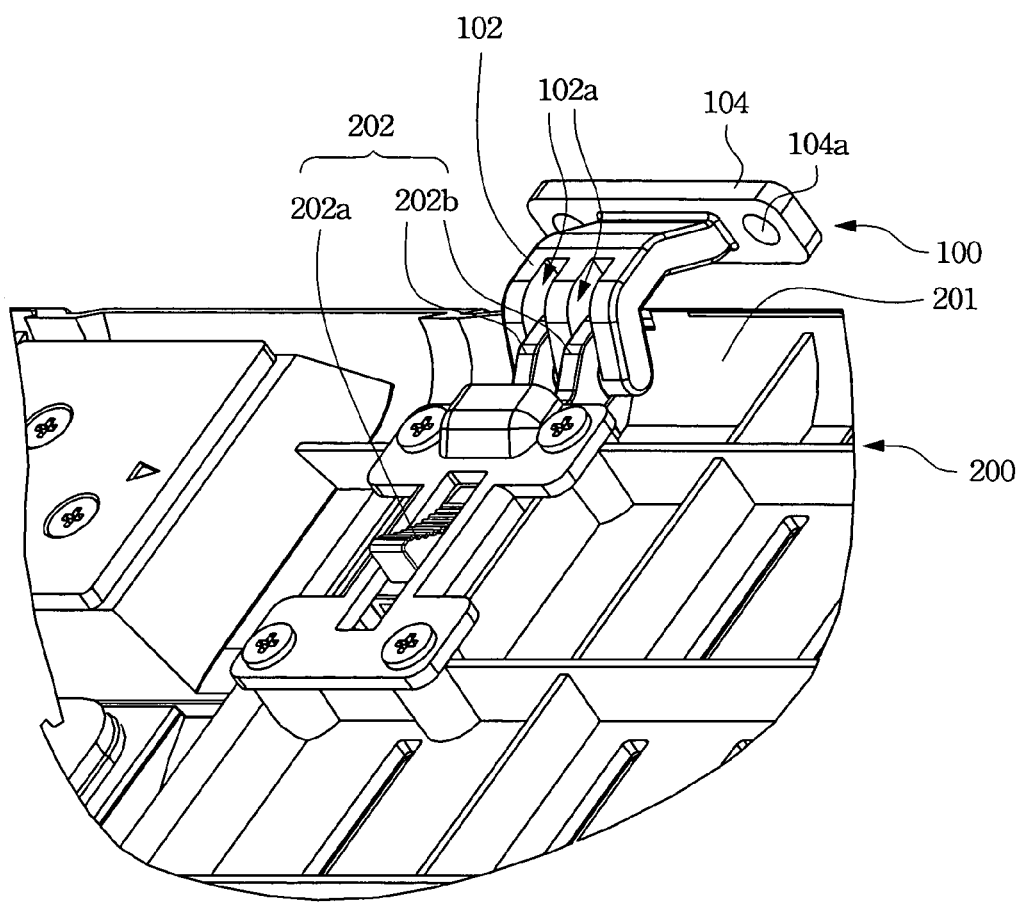
FIG. 1 illustrates a perspective view of a fast disassembling joint structure according to one preferred embodiment of this invention, wherein a removable part is fixed on a base part.

Reference will now be made in detail to the present preferred embodiments of the invention, examples of which are illustrated in the accompanying drawings. Wherever possible, the same reference numbers are used in the drawings and the description to refer to the same or like parts.

Figure 2:
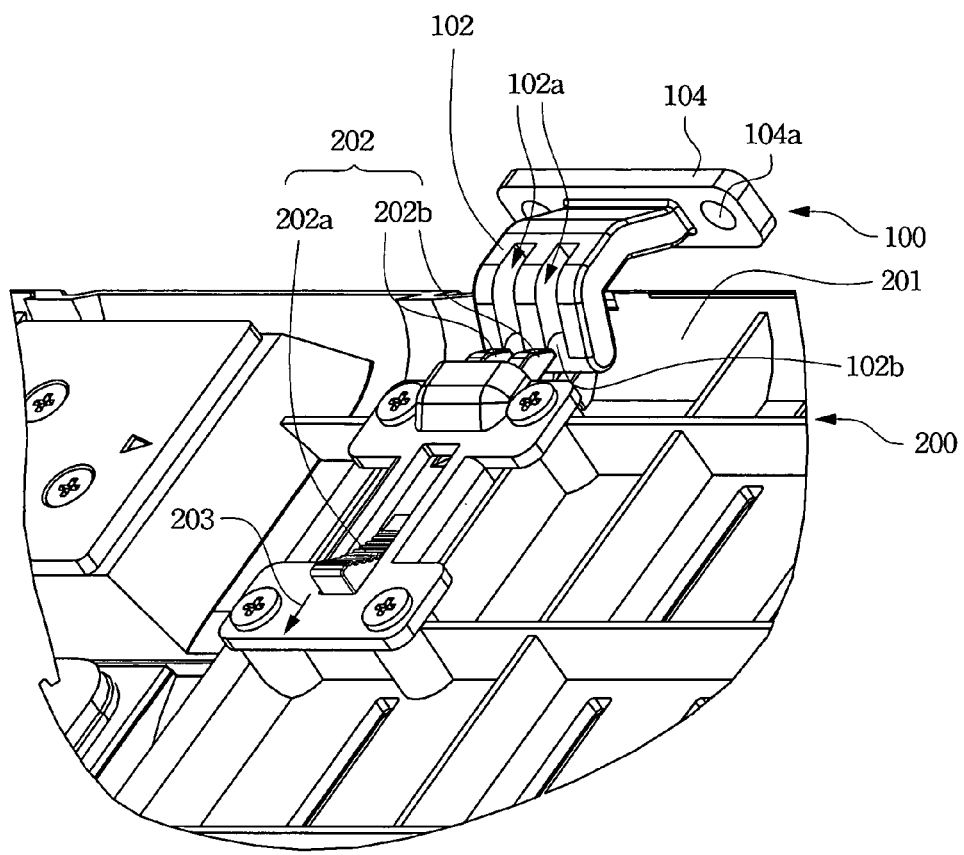
FIG. 2 illustrates a perspective view of a fast disassembling joint structure according to one preferred embodiment of this invention, wherein a movable clamp is open.

FIGS. 1 and 2 illustrate perspective views of a fast disassembling joint structure according to one preferred embodiment of this invention. The fast disassembling joint structure includes a base part 200 and a removable part 100. The removable part 100 is secured to a desired structure (not illustrated) by screws fastening its plate 104 (via screw holes 104a). The removable part 100 is pivotally connected to a housing 201 of the base part 200. Specifically, an arm 102 of the removable part 100 is pivotally connected to the housing 201 of the base part 200. An insertion section 202b of a movable clamp 202 engages a recess 102a of the arm 102 so as to secure the removable part 100 to the housing 201. A user may pull a handle 202a along a direction 203 to withdraw the insertion section 202a so that the removable part 100 can be pulled apart from the housing 201 (as illustrated in FIG. 2).

Figure 3:
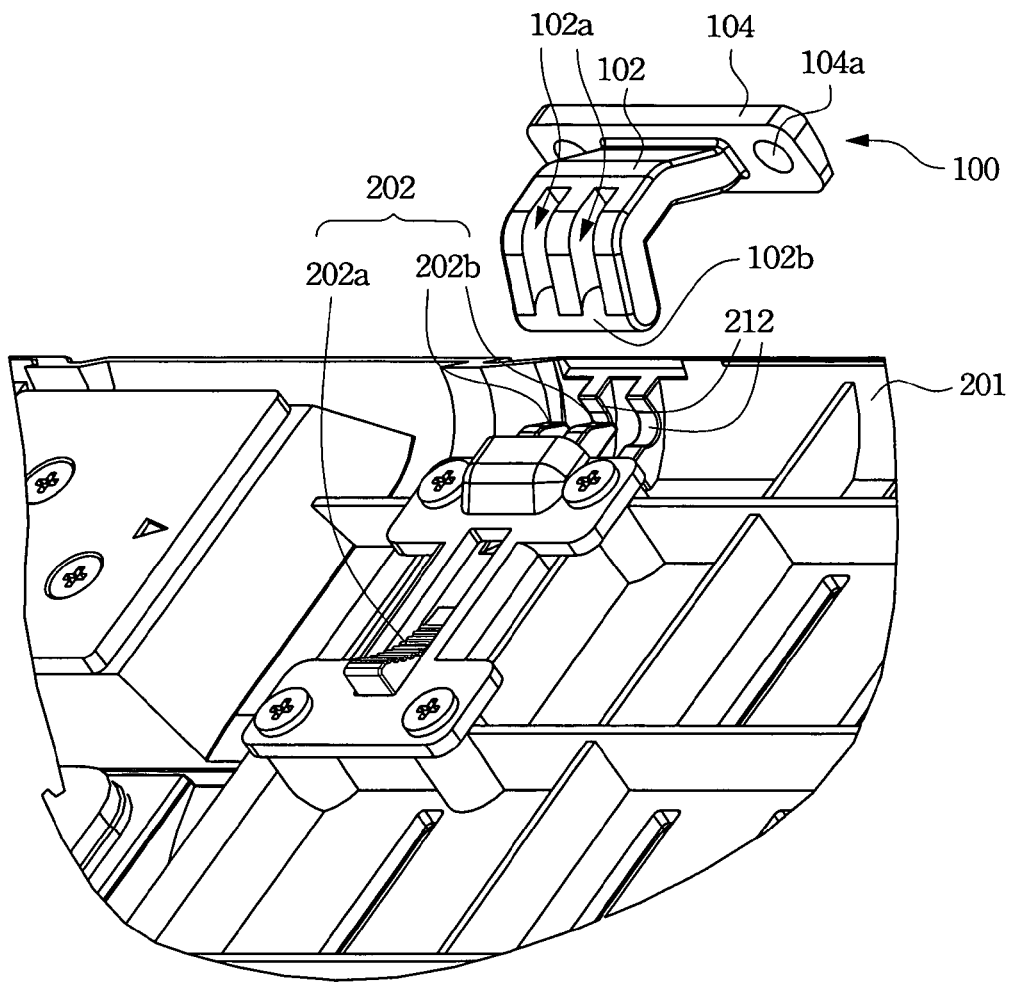
FIG. 3 illustrates a perspective view of a fast disassembling joint structure according to one preferred embodiment of this invention, wherein a removable part is pulled apart from a base part.

FIG. 3 illustrates a perspective view of a fast disassembling joint structure according to one preferred embodiment of this invention, wherein a removable part is pulled apart from a base part. A cylinder-shaped shaft 102b (part of the arm 102) of the removable part 100 is confined in a slot 212 of the housing 201. The slot 212 can be a semi-circular shaped concavity. Thus, the removable part 100 can rotate with relation to the base part 200 when the slot 212 confines the cylinder-shaped shaft 102*b*.

Figure 4:
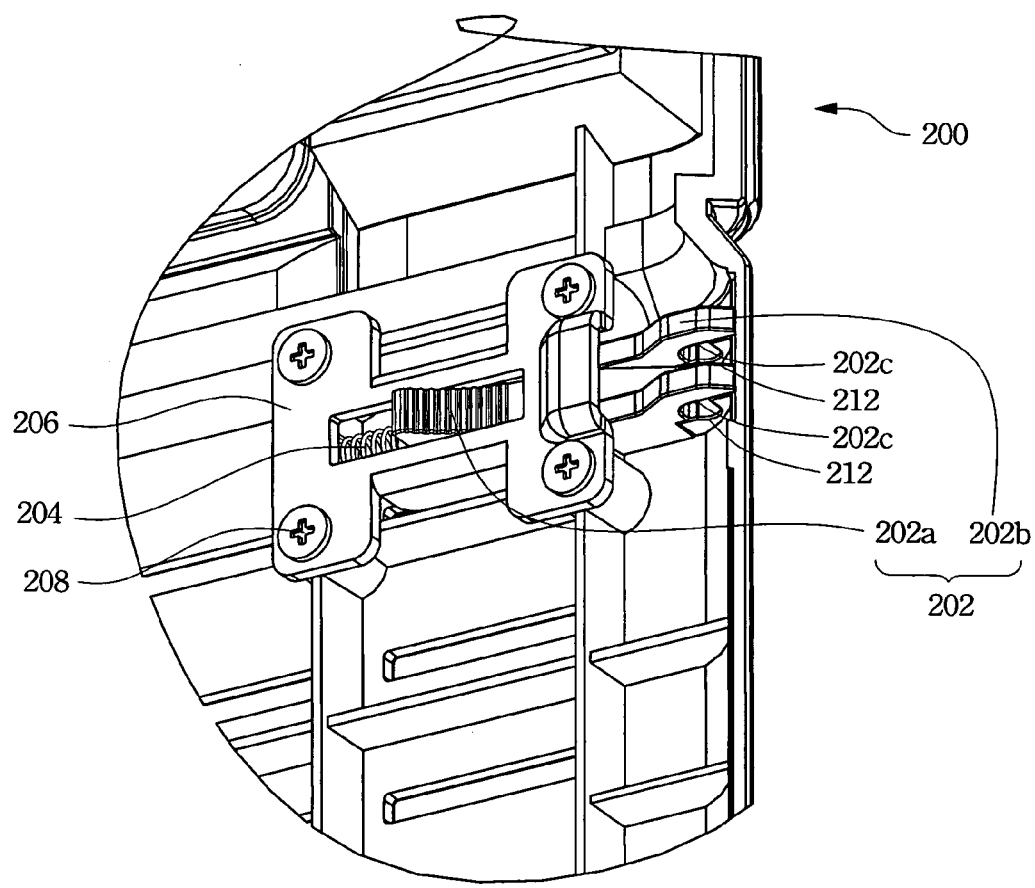
FIG. 4 illustrates a perspective view of a base part of a fast disassembling joint structure according to one preferred embodiment of this invention.

FIG. 4 illustrates a perspective view of a base part of a fast disassembling joint structure according to one preferred embodiment of this invention. The insertion section 202*b* also has a slot 202*c*, which is also a semi-circular shaped concavity. Thus, the slot 202*c* and the slot 212 are assembled to form a cylinder-shaped chamber so as to confine the cylinder-shaped shaft 102*b* of the arm 102. The movable clamp 202 is secured to the housing 201 (refer to FIG. 3) by means of a top cover 206. The handle 202*a* of the movable clamp 202 extends out of the top cover 206 via its opening for manual operation. The movable clamp 202, driven by a spring 204, provides a push force to assemble the slot 202*c* and the slot 212 in order to form the cylinder-shaped chamber, such that the cylinder-shaped shaft 102*b* of the arm 102 is confined in the cylinder-shaped chamber (refer to FIG. 3).

Figure 5:
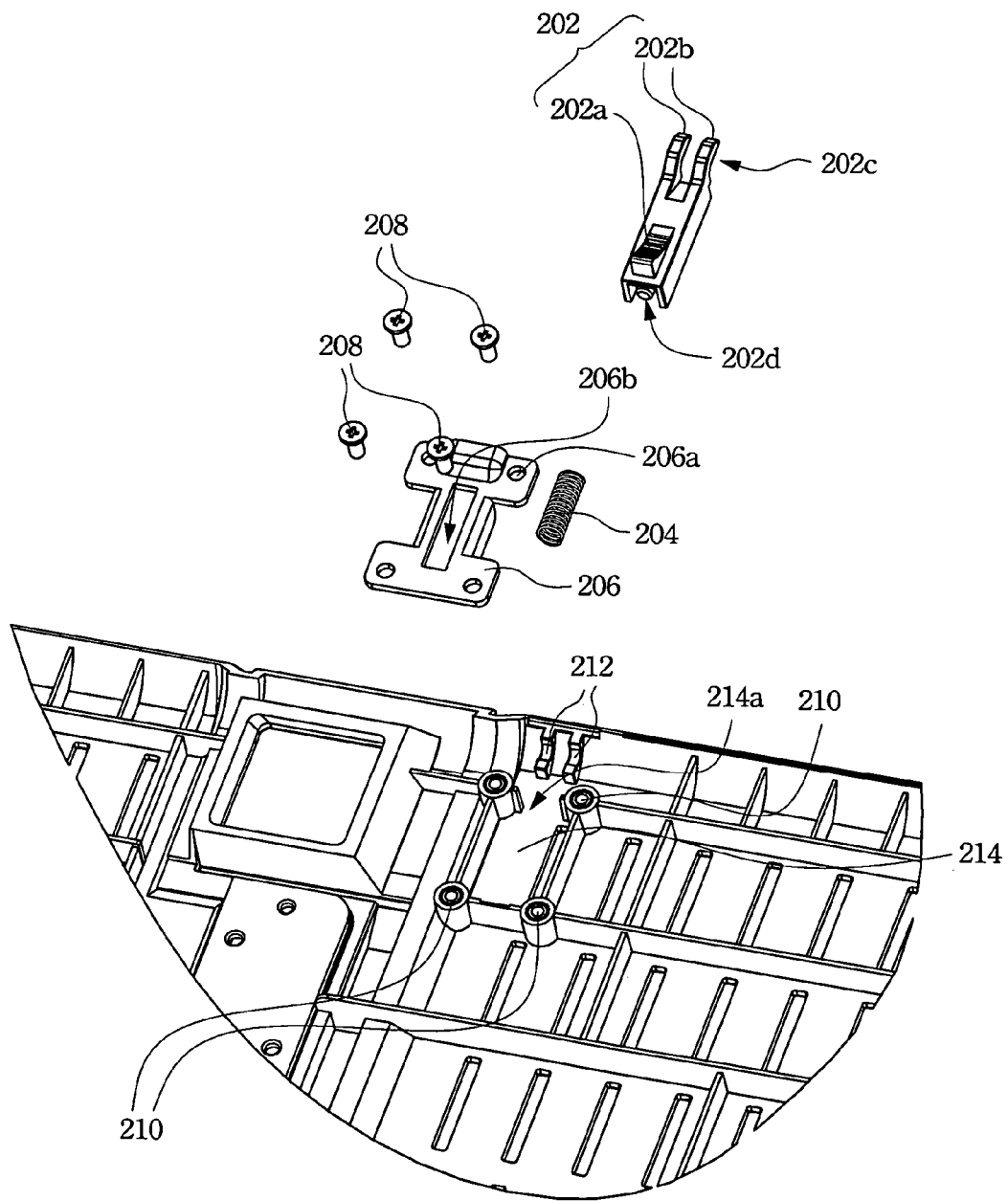
FIG. 5 illustrates a exploded view of a base part of a fast disassembling joint structure according to one preferred embodiment of this invention.

FIG. 5 illustrates an exploded view of a base part of a fast disassembling joint structure according to one preferred embodiment of this invention. The movable clamp 202 is assembled in a raceway 214 of the housing 201. The raceway 214 has a cutout 214*a*, serving as an outlet for moving the movable clamp 202 thereof. The cutout 214*a* corresponds to the slot 212. Four screw holes 210 around the raceway 214 allow mounting of the top cover 206. The movable clamp 202 includes a holder 202*d* to position the spring 204 in the raceway 214. The top cover has 4 screw holes 206*a*, and 4 screws 208 are respectively used to fasten to 4 screw holes 210 of the housing 206. The handle 202*a* of the movable clamp 206 extends out of the top cover 206 via the opening 206*a*.

According to preferred embodiments of present invention, a fast disassembling joint structure is used in some applications that need to be frequently assembled and disassembled in order to save time and labor in removing the screws that fasten the joint structure to the housing.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fast disassembling joint structure for dissembling and assembling a desired apparatus easily, comprising:
    a removable part, having two ends, one end being secured to the desired apparatus, the other end having a cylinder-shaped shaft and at least one recess adjacent to said cylinder-shaped shaft; and
    a base part, being pivotally connected with the cylinder-shaped shaft of said removable part, said base part comprising:
        a housing, having a raceway and a first semi-circular concavity, said raceway having a cutout aligned with said semi-circular concavity;
        a movable clamp, being assembled in said raceway, said movable clamp having a handle and an insertion section to engage in said at least one recess, said insertion section having a second semi-circular concavity being assembled with said first semi-circular concavity to confine said cylinder-shaped shaft;
        a spring, being assembled in said raceway and connected with said movable clamp to provide a push force for confining said cylinder-shaped shaft; and
        a top cover, having an opening, said top cover being secured on top of said raceway to assemble said spring and said movable clamp inside, said handle being extended out of said opening so that a user can pull said handle to move said movable clamp along said raceway in order to quickly disassemble said removable part.

2. The fast disassembling joint structure of claim 1, wherein said movable clamp has a holder to position said spring.

3. The fast disassembling joint structure of claim 1, wherein said top cover includes several screw holes for mounting on said raceway.

4. The fast disassembling joint structure of claim 1, wherein said housing includes several screw holes around said raceway for securing said top cover.

5. A fast disassembling joint structure for an electronic device, the electronic device including a desired device and a base part, comprising:
    a removable part, having two ends, one end being secured to the desired apparatus, the other end having a cylinder-shaped shaft and at least one recess adjacent to said cylinder-shaped shaft; and
    the base part, being pivotally connected with the cylinder-shaped shaft of said removable part, said base part comprising:
        a housing, having a raceway and a first semi-circular concavity, said raceway having a cutout aligned with said semi-circular concavity;
        a movable clamp, being assembled in said raceway, said movable clamp having a handle and an insertion section to engage in said at least one recess, said insertion section having a second semi-circular concavity being assembled with said first semi-circular concavity to confine said cylinder-shaped shaft;
        a spring, being assembled in said raceway and connected with said movable clamp to provide a push force for confining said cylinder-shaped shaft; and
        a top cover, having an opening, said top cover being secured on top of said raceway to assemble said spring and said movable clamp inside, said handle being extended out of said opening so that a user can pull said handle to move said movable clamp along said raceway in order to quickly disassemble said removable part.

6. The fast disassembling joint structure of claim 5, wherein said movable clamp has a holder to position said spring.

7. The fast disassembling joint structure of claim 5, wherein said top cover includes several screw holes for mounting on said raceway.

8. The fast disassembling joint structure of claim 5, wherein said housing includes several screw holes around said raceway for securing said top cover.

* * * * *